US008664115B2

(12) United States Patent
Bartsch et al.

(10) Patent No.: US 8,664,115 B2
(45) Date of Patent: Mar. 4, 2014

(54) COPPER INTERCONNECT WITH METAL HARDMASK REMOVAL

(75) Inventors: Christin Bartsch, Stolpen OT (DE); Susanne Leppack, Dresden (DE)

(73) Assignee: GLOBALFOUNDRIES Inc.

( * ) Notice: Subject to any disclaimer, the term of this patent is extended or adjusted under 35 U.S.C. 154(b) by 295 days.

(21) Appl. No.: 13/158,114

(22) Filed: Jun. 10, 2011

(65) Prior Publication Data

US 2012/0315755 A1    Dec. 13, 2012

(51) Int. Cl.
*H01L 21/4763* (2006.01)
(52) U.S. Cl.
USPC ............... 438/653; 438/38; 438/958; 257/56; 257/58; 257/62; 257/626; 257/E21.584
(58) Field of Classification Search
None
See application file for complete search history.

(56) References Cited

U.S. PATENT DOCUMENTS

| 6,440,753 | B1 | 8/2002 | Ning et al. |
| 7,259,091 | B2 | 8/2007 | Schuehrer et al. |
| 7,670,497 | B2 * | 3/2010 | Fitzsimmons et al. ......... 216/13 |
| 2010/0081277 | A1 * | 4/2010 | Schaller et al. .............. 438/653 |
| 2010/0190347 | A1 * | 7/2010 | RamachandraRao et al. ............................ 438/703 |

* cited by examiner

*Primary Examiner* — Julio Maldonado
*Assistant Examiner* — Yasser Abdelaziez
(74) *Attorney, Agent, or Firm* — Ditthavong Mori & Steiner, P.C.

(57) ABSTRACT

A passivation layer is formed on inlaid Cu for protection against oxidation and removal during subsequent removal of an overlying metal hardmask. Embodiments include treating an exposed upper surface of inlaid Cu with hydrofluoric acid and a copper complexing agent, such as benzene triazole, to form a passivation monolayer of a copper complex, etching to remove the metal hardmask, removing the passivation layer by heating to at least 300° C., and forming a barrier layer on the exposed upper surface of the inlaid Cu.

20 Claims, 2 Drawing Sheets

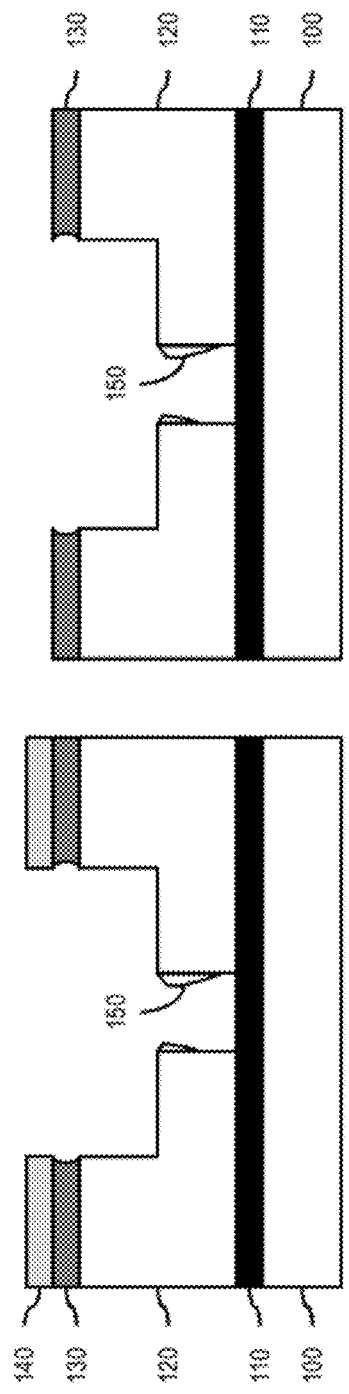
Fig. 1A Background Art
Fig. 1C Background Art
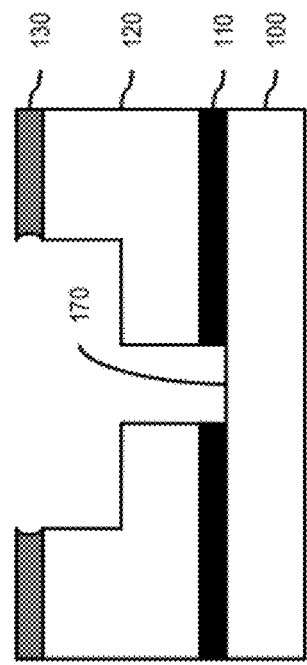
Fig. 1B Background Art
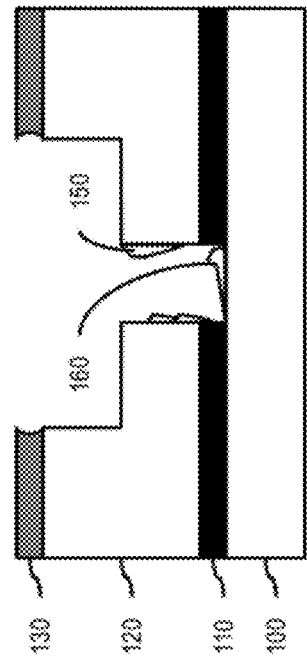
Fig. 1D Background Art

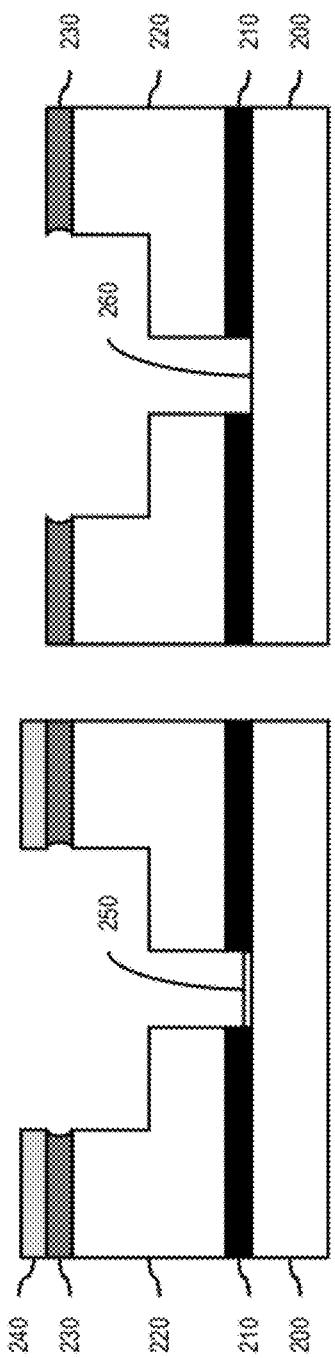
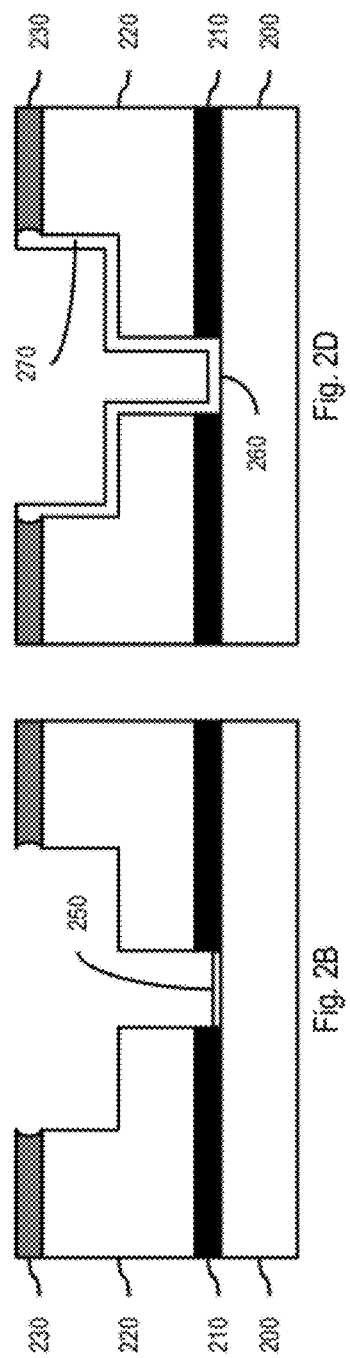
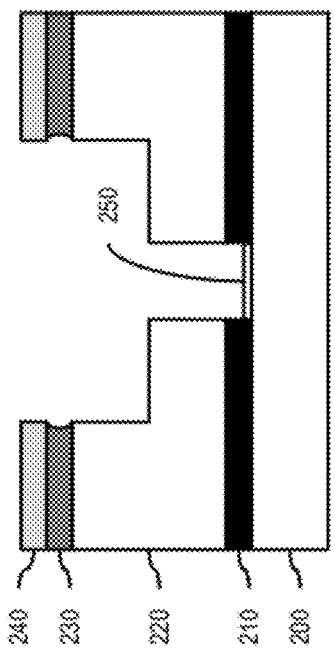
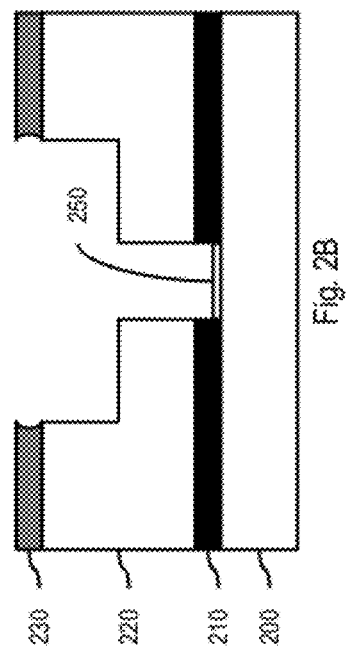

COPPER INTERCONNECT WITH METAL HARDMASK REMOVAL

TECHNICAL FIELD

The present disclosure relates to a method of fabricating semiconductor devices having improved interconnect reliability with increased manufacturing throughput. The present disclosure is particularly applicable to fabricating semiconductor devices having copper interconnects using a metal hardmask.

BACKGROUND

As technological advances in the semiconductor industry plunge deeper into submicron geometries, the number of circuit elements increases, necessitating an increase in the number of electrical interconnects to provide the desired circuit functionality. Copper and copper alloys have become the interconnect materials of choice because of their low resistance, thereby enabling enhanced performance.

Conventional fabrication techniques comprise forming an inlaid copper wiring pattern 100 in a dielectric layer 120, as illustrated in FIG. 1A. An etch stop layer 110 is formed on an upper surface of inlaid copper 100, an interlayer dielectric 120 formed thereon, and a capping layer 130 formed on interlayer dielectric 120. A metal hardmask 140 is then formed over capping layer 130. Subsequent processing by any of various conventional techniques results in the formation of an opening, such as a dual damascene opening, in interlayer dielectric 120 through metal hardmask 140. As a result of such etching, polymeric deposits 150 typically form in the via opening portion of the dual damascene opening. Subsequently, as illustrated in FIG. 1B, the hardmask 140 is removed by wet chemical etching, as with tetramethyl ammonium hydroxide (TMAH) or tetraethyl ammonium hydroxide (TEAH). During such etching it is necessary to maintain etch stop layer 110 on the upper surface of the inlaid copper 100 to prevent oxidation and removal of copper, as such oxidation would prevent electrical contact of conductive material subsequently deposited in the opening.

Dry etching is then conducted to remove the exposed portion of etch stop layer 110 in order to expose a portion of the upper surface of the inlaid copper, as shown in FIG. 1C, resulting in additional etching residues 160, such as copper containing CF polymers. Subsequently, it is necessary to perform an additional cleaning step to remove the polymeric deposits 150 and etching residues 160, and any copper oxide that may have formed, as with dilute hydrofluoric acid (HF). An upper surface 170 of the inlaid copper is thereby cleared, as illustrated in FIG. 1D.

Such conventional practices involve a dry etching step (FIG. 1A), a wet etching step (FIG. 1B), a dry etching step again (FIG. 1C), and another wet etching step (FIG. 1D). This sequence of etching steps burdens transport capacity and increases the number of tools required and, hence, decreases manufacturing throughput.

A need therefore exists for methodology enabling the fabrication of semiconductor devices having features in the deep submicron range utilizing a metal hardmask and forming copper and copper alloy interconnects, with improved efficiency and increased manufacturing throughput.

SUMMARY

An aspect of the present disclosure is a method of fabricating a semiconductor device comprising forming copper interconnects structures utilizing a metal hardmask with reduced cleaning steps and increased manufacturing throughput.

Another aspect of the present disclosure is a method of fabricating a semiconductor device comprising copper interconnects utilizing a metal hardmask with a reduced number of tools, thereby increasing manufacturing throughput.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

Aspects of the present disclosure include forming an intermediate structure comprising: inlaid copper (Cu); an interlayer dielectric over the inlaid Cu: a metal hardmask over the interlayer dielectric; and a patterned opening formed in the interlayer dielectric exposing a portion of an upper surface of the inlaid Cu; forming a passivation layer on the exposed surface of the inlaid Cu; and removing the metal hardmask, whereby the passivation layer protects the underlying inlaid Cu during removal of the metal hardmask. Aspects include forming the passivation layer by treating the exposed upper surface of the inlaid Cu with HF and a copper complexing agent, such as benzene triazole or 1,2,4 triazole, and removing the passivation layer after removing the metal hardmask, e.g., titanium nitride, as by heating at a temperature of at least 300° C., e.g., 350° C. to 400° C., and depositing a barrier layer on the exposed upper surface layer of the inlaid copper, and a seed layer. Embodiments include forming a copper complex passivation layer at a thickness of one monolayer.

Additional aspects of the present disclosure include placing a semiconductor wafer in a wafer cleaning tool, the semiconductor wafer comprising: inlaid copper (Cu); a dielectric layer, over the inlaid Cu, having an opening therein exposing an upper surface of the inlaid Cu; and a metal hardmask over the dielectric layer; treating the exposed upper surface of the inlaid Cu with hydrofluoric acid and a copper complexing agent to form a passivation layer thereon; removing the metal hardmask while in the same wafer cleaning tool, whereby the passivation layer protects the inlaid Cu during removal of the metal hardmask; and removing the passivation layer.

Other aspects of the present disclosure include providing a dielectric layer over inlaid copper (Cu); providing a metal hardmask over the dielectric layer; forming an opening in the dielectric layer through the metal hardmask exposing a portion of an upper surface of the inlaid Cu; forming a passivation monolayer comprising a copper complex on the exposed upper surface of the inlaid Cu to protect the inlaid Cu during subsequent removal of the metal hardmask; etching to remove the metal hardmask; removing the passivation layer at a temperature of at least 300° C.; and forming a barrier layer on the upper surface of the inlaid Cu.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1D illustrate sequential steps in accordance with background art; and FIGS. 2A through 2D schematically illustrate sequential steps in accordance with an embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are not shown to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about." As employed throughout this disclosure and claims, the symbol Cu is intended to encompass elemental copper and copper alloys.

The present disclosure addresses and solves, inter alia, problems attendant upon fabricating semiconductor devices by forming Cu interconnects utilizing a metal hardmask to pattern openings in a dielectric layer to expose underlying inlaid Cu. Conventional practices require multiple sequential cleaning steps, e.g., dry, wet, dry, and wet cleaning steps, necessitating the use of multiple tools, thereby encumbering production throughput. Attempts to alleviate this problem have not been satisfactory in view of the hypersensitivity of copper to oxidize under various processing conditions, particularly during the removal of the metal hardmask. Embodiments of the present disclosure address and solve these problems by removing the capping layer on underlying inlaid Cu prior to removing the metal hardmask. A wet cleaning technique is then employed to form a passivation monolayer on the exposed upper surface of the inlaid Cu. Such a protective passivation monolayer prevents oxidation and/or removal of the exposed inlaid Cu during removal of the metal hardmask. Subsequently, the passivation monolayer is removed, as by vaporization at a temperature of at least 300° C. Subsequent processing proceeds in a conventional manner, as by deposition of a barrier and seed layer, or a barrier/seed layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

A method in accordance with an embodiment of the present disclosure is schematically illustrated in FIGS. 2A through 2D. Adverting to FIG. 2A, a portion of inlaid Cu wiring is denoted by reference character 200. An etch stop layer 210 is formed on the upper surface of the inlaid Cu. Capping layer 210 may comprise any of conventional capping layer materials, such as silicon nitride, silicon carbide, or nitrogen-enriched silicon carbide. An interlayer dielectric 220 is formed and another capping layer 230 formed thereon. Capping layer 230 may also comprise OMCTS and/or TEOS. A metal hardmask 240 is formed overlying capping layer 230.

Metal hardmask 240 may comprise any of conventional metal hardmasks employed in the fabrication of semiconductor devices, such as titanium nitride. Other metal hardmask materials include tungsten, tantalum nitride, and tantalum. An opening is then formed through capping layer 230 and interlayer dielectric 220 exposing an upper surface of inlaid copper 200. The opening is formed in a conventional manner through metal hardmask 240 and may comprise, for example, a via opening, a trench, or a dual damascene opening comprising an upper trench and lower via opening (as illustrated).

With continuing reference to FIG. 2A, in accordance with an embodiment of the present disclosure, a first wet cleaning step is implemented employing HF and a substance that will form a complex with copper, such as benzene triazole, or 1,2,4 triazole. During this initial wet cleaning step, not only are any polymeric and oxide residues removed, but a passivation layer 250 is formed on the exposed surface of the inlaid Cu. The passivation layer is a monolayer, i.e., one atomic layer, of a copper complex, such as [Cu(I)BTA]. Advantageously, the copper complex protects the underlying Cu from oxidation and removal during subsequent removal of the metal hardmask 240.

After forming passivation layer 250, metal hardmask 240 is removed in a second cleaning step. In embodiments of the present disclosure, a titanium nitride metal hardmask is removed using TMAH or TEAH, which etchants would otherwise oxidize and remove portions of the underlying Cu. Advantageously, both the first cleaning step to form passivation layer 250 and the second cleaning step to remove the metal hardmask are implemented while in a single cleaning tool, thereby reducing wafer transport and the number of tools required and, hence, increasing manufacturing throughput.

Subsequent to removing the metal hardmask, the passivation layer 250 is removed, as by heating at a suitable temperature, as at 300° C. or above, e.g., 350° C. to 400° C., resulting in the intermediate structure illustrated in FIG. 2C. Processing is conducted in accordance with conventional techniques and comprise, inter alia, depositing a barrier layer 270 on the exposed upper surface 260 of the underlying Cu and lining the opening. Advantageously, the barrier layer may be deposited at a temperature sufficiently high, e.g., above 300° C. to remove the passivation layer, thereby further increasing manufacturing throughput by eliminating a separate step. In certain embodiments of the present disclosure, a metallic barrier layer may be electrolessly plated that serves a dual role as a seed layer. Suitable examples include electrolessly plating metallic cobalt that blocks the diffusion of copper into the surrounding dielectric and serves as a seed layer for the subsequent electro deposition of Cu.

In accordance with embodiments of the present disclosure, interlayer dielectric 220 may comprise any conventional dielectric material employed in the fabrication of semiconductor devices, such as a silicon oxide, e.g., a silicon oxide derived from tetraethyl orthosilicate (TEOS), or a conventional low-K dielectric material. Although not illustrated for illustrative convenience, semiconductor devices fabricated in accordance with the present technique may be based on any conventional substrate, such as bulk silicon, strained silicon, or silicon on insulator (SOI) substrates. Capping layers 210 and 240 may be formed in a conventional manner at conventional thicknesses, such as 50 Å to 400 Å.

The embodiments of the present disclosure achieve several technical effects, particularly in fabricating semiconductor devices with dimensions in the deep submicron range by enhancing process flow while increasing device performance, yield, and reliability. Embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming an intermediate structure comprising:
      inlaid copper (Cu);
      an interlayer dielectric over the inlaid Cu:
      a metal hardmask over the interlayer dielectric; and
      a patterned opening formed in the interlayer dielectric exposing a portion of an upper surface of the inlaid Cu;
   forming a passivation layer on the exposed surface of the inlaid Cu; and
   after forming the passivation layer, removing the metal hardmask, whereby the passivation layer protects the underlying inlaid Cu during removal of the metal hardmask.

2. The method according to claim 1, further comprising removing the passivation layer after removing the metal hardmask.

3. The method according to claim 2, comprising removing the passivation layer at a temperature of at least 300° C.

4. The method according to claim 3, comprising removing the passivation layer at a temperature of 350° C. to 400° C.

5. The method according to claim 1, further comprising:
   removing the passivation layer; and
   depositing a barrier layer on the exposed upper surface of the inlaid Cu.

6. The method according to claim 1, wherein the metal hardmask comprises titanium nitride.

7. The method according to claim 1, comprising forming the passivation layer by treating the exposed upper surface of the inlaid Cu with hydrofluoric acid and a copper complexing agent.

8. The method according to claim 7, comprising treating the exposed upper surface of the inlaid Cu with a mixture comprising hydrofluoric acid and benzene triazole.

9. The method according to claim 7, comprising forming the passivation layer at a thickness of one monolayer.

10. The method according to claim 7, comprising removing the passivation layer at a temperature of at least 300° C.

11. The method according to claim 10, comprising removing the passivation layer at a temperature of at 350° C. to 400° C.

12. The method according to claim 7, comprising forming the passivation layer and removing the metal hardmask while in the same tool.

13. A method comprising:
   placing a semiconductor wafer in a wafer cleaning tool, the semiconductor wafer comprising:
      inlaid copper (Cu);
      a dielectric layer over the inlaid Cu having an opening therein exposing an upper surface of the inlaid Cu; and
      a metal hardmask over the dielectric layer;
   treating the exposed upper surface of the inlaid Cu with hydrofluoric acid and a copper complexing agent to form a passivation layer thereon;
   removing the metal hardmask while in the same wafer cleaning tool, whereby the passivation layer protects the inlaid Cu during removal of the metal hardmask; and
   removing the passivation layer.

14. The method according to claim 13, comprising forming the passivation layer at a thickness of one monolayer.

15. The method according to claim 13, wherein the metal hardmask comprises titanium nitride.

16. The method according to claim 15, comprising removing the passivation layer by heating at a temperature of at least 300° C.

17. The method according to claim 16, comprising removing the passivation layer at a temperature of 350° C. to 400° C.

18. A method comprising:
   providing a dielectric layer over inlaid copper (Cu);
   providing a metal hardmask over the dielectric layer;
   forming an opening in the dielectric layer through the metal hardmask exposing a portion of an upper surface of the inlaid Cu;
   forming a passivation monolayer comprising a copper complex on the exposed upper surface of the inlaid Cu to protect the inlaid Cu during subsequent removal of the metal hardmask;
   after forming the passivation layer, etching to remove the metal hardmask;
   removing the passivation layer at a temperature of at least 300° C.; and
   forming a barrier layer on the upper surface of the inlaid Cu.

19. The method according to claim 18, comprising treating the exposed upper surface of the inlaid Cu with hydrofluoric acid and a copper complexing agent to form the passivation layer.

20. The method according to claim 19, comprising treating the exposed upper surface of the inlaid Cu with hydrofluoric acid and benzene triazole to form the passivation layer.

* * * * *